United States Patent
Hashimoto

(10) Patent No.: US 7,768,494 B2
(45) Date of Patent: Aug. 3, 2010

(54) CIRCUIT DEVICES

(75) Inventor: Kazuyuki Hashimoto, Kobe (JP)

(73) Assignee: TPO Hong Kong Holding Limited, Shatin (HK)

( * ) Notice: Subject to any disclaimer, the term of this patent is extended or adjusted under 35 U.S.C. 154(b) by 819 days.

(21) Appl. No.: 11/640,194

(22) Filed: Dec. 18, 2006

(65) Prior Publication Data
US 2007/0139351 A1     Jun. 21, 2007

(30) Foreign Application Priority Data
Dec. 20, 2005     (JP)     ............... 2005-365686

(51) Int. Cl.
*G09G 3/36*     (2006.01)

(52) U.S. Cl. .............. 345/100; 345/98; 345/99
(58) Field of Classification Search ............ 330/297; 348/730; 345/100, 98, 99
See application file for complete search history.

(56) References Cited

U.S. PATENT DOCUMENTS
7,038,653 B2 *    5/2006 Moon ................ 345/100

FOREIGN PATENT DOCUMENTS
CN          1677672 A     10/2005

\* cited by examiner

*Primary Examiner*—Amare Mengistu
*Assistant Examiner*—Joseph G Rodriguez
(74) *Attorney, Agent, or Firm*—Birch, Stewart, Kolasch & Birch, LLP

(57) ABSTRACT

The invention provides a circuit device for reducing the number of fabrication processes. A circuit portion 12 provides power supply voltage $V_{10}$ to a node N0 through a first route 52 and power supply voltage $V_{-5}$ to the node N0 through a second route 62. The circuit device includes a TFT 50 disposed on the first route 52, a TFT 60 disposed on the first route 52 and coupled to the TFT 50, a TFT 60 disposed on the second route 62, a TFT 61 disposed on the second route 62 and coupled to the TFT 60, a third route 54 providing power supply voltage $V_5$ between $V_{10}$ and $V_{-5}$ to between the TFT 50 and 51, and a fourth route 64 providing power supply voltage $V_0$ between $V_{10}$ and $V_{-5}$ to between the TFT 60 and 61.

16 Claims, 9 Drawing Sheets

| | |
|---|---|
| Withstand voltage between gate and source | 15V |
| Withstand voltage between gate and drain | 15V |
| Withstand voltage between drain and source | 10V |

FIG. 2 (RELATED ART)

|       | Vgs  | Vgd  | Vds |
|-------|------|------|-----|
| TFT50 | -10V | -10V | 0V  |
| TFT51 | -10V | -10V | 0V  |
| TFT53 | 5V   | 0V   | 5V  |

FIG. 6

|       | Vgs  | Vgd  | Vds |
|-------|------|------|-----|
| TFT60 | -5V  | -15V | 10V |
| TFT61 | 0V   | -5V  | 5V  |
| TFT63 | 10V  | 10V  | 0V  |

FIG. 7

|       | Vgs | Vgd | Vds |
|-------|-----|-----|-----|
| TFT60 | 10V | 10V | 0V  |
| TFT61 | 10V | 10V | 0V  |
| TFT63 | -5V | 0V  | -5V |

FIG. 8

|       | Vgs  | Vgd  | Vds  |
|-------|------|------|------|
| TFT50 | 5V   | 15V  | -10V |
| TFT51 | 0V   | 5V   | -5V  |
| TFT53 | -10V | -10V | 0V   |

FIG. 9

|       | Vgs  | Vgd  | Vds |
|-------|------|------|-----|
| TFT70 | -10V | -10V | 0V  |
| TFT71 | -5V  | -5V  | 0V  |
| TFT73 | 0V   | -5V  | 5V  |

FIG. 11

|       | Vgs | Vgd  | Vds |
|-------|-----|------|-----|
| TFT80 | 0V  | -10V | 10V |
| TFT81 | 0V  | -5V  | 5V  |
| TFT83 | -5V | -5V  | 0V  |

FIG. 12

|       | Vgs | Vgd | Vds |
|-------|-----|-----|-----|
| TFT80 | 10V | 10V | 0V  |
| TFT81 | 5V  | 5V  | 0V  |
| TFT83 | 0V  | 5V  | -5V |

FIG. 13

|       | Vgs | Vgd | Vds  |
|-------|-----|-----|------|
| TFT70 | 0V  | 10V | -10V |
| TFT71 | 0V  | 5V  | -5V  |
| TFT73 | 5V  | 5V  | 0V   |

FIG. 14

CIRCUIT DEVICES

BACKGROUND OF THE INVENTION

1. Field of the Invention

The invention relates to a circuit device providing a first voltage to a node through a first route and a second voltage providing a second voltage to the node through a second route.

2. Description of the Related Art

Recent technologies used in formation of thin film transistors (TFTs) on glass substrate have developed with utilization of low temperature polysilicon. Such technologies are also applied in manufacture of display panels, wherein TFT array is formed on a display region of a glass substrate while gate driver and source driver are formed on a non-display region around the display region.

Generally, when a gate driver receives a signal, it shifts voltage level of the received signal. Accordingly, the gate driver comprises transistors of different withstanding voltages.

To form transistors of different withstanding voltages, thicknesses, for example, of gate insulating films of transistors must be different. However, transistors of different gate insulating films cannot be formed by the same fabricating process, thus, required different processes for fabricating such transistors increase.

BRIEF SUMMARY OF INVENTION

An object of the invention is to provide a circuit device requiring fewer processes for fabrication of transistors thereon.

To achieve the object, the invention provides a circuit device providing a first voltage to a node through a first route and a second voltage to the node through a second route. The circuit device comprises: a first switching device disposed on the first route; a second switching device disposed on the first route and coupled to the first switching device; a third switching device disposed on the second route; a fourth switching device disposed on the second route and coupled to the third switching device; a third route providing a third voltage between the first and second voltages to between the first and second switching devices; and a fourth route providing a fourth voltage between the first and second voltages to between the first and second switching devices.

The circuit device of the invention can provide the third voltage to between the first and second switching devices by the third route, and provide fourth voltage to between the third and fourth switching devices by the fourth route, thereby making voltages respectively applied to the first, second, third and fourth transistors less than the difference between the first and second voltages. Thus, even though the difference between the first and second voltages exceeds respective withstanding voltages of the first to fourth switching devices, the first and second voltages can still be obtained from the node. As a result, the circuit device of the invention can use switching devices unsuited to conventional circuit devices due to smaller withstanding voltages and therefore accept wide design flexibility. Accordingly, when circuit devices of the invention and other circuit devices are formed on the same substrate, even though voltage levels obtained by the circuit device of the invention are different from those of other circuit devices, the circuit device of the invention and other circuit devices can be made by switching devices of the same sizes. Thus, all switching devices formed of the substrate can be fabricated using the same process, thereby reducing number of fabricating processes required.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 2 shows characteristics of withstanding voltage of TFT.

FIG. 6 shows voltages Vgs, Vgd and Vds of TFTs 50, 51 and 53 when the second circuit portion 12 receives 5V voltage from the input portion 12a.

FIG. 7 shows voltages Vgs, Vgd and Vds of TFTs 60, 61 and 63 when the second circuit portion 12 receives 5V voltage from the input portion 12a.

FIG. 8 shows voltages Vgs, Vgd and Vds of TFTs 60, 61 and 63 when the second circuit portion 12 receives 0V voltage from the input portion 12a.

FIG. 9 shows voltages Vgs, Vgd and Vds of TFTs 50, 51 and 53 when the second circuit portion 12 receives 0V voltage from the input portion 12a.

FIG. 11 shows voltages Vgs, Vgd and Vds of TFTs 70, 71 and 73 when the second circuit potion 120 receives 5V voltage from the input portion 120a.

FIG. 12 shows voltages Vgs, Vgd and Vds of TFTs 80, 81 and 83 when the second circuit potion 120 receives 5V voltage from the input portion 120a.

FIG. 13 shows voltages Vgs, Vgd and Vds of TFTs 80, 81 and 83 when the second circuit potion 120 receives 0V voltage from the input portion 120a.

FIG. 14 shows voltages Vgs, Vgd and Vds of TFTs 70, 71 and 73 when the second circuit potion 120 receives 0V voltage from the input portion 120a.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
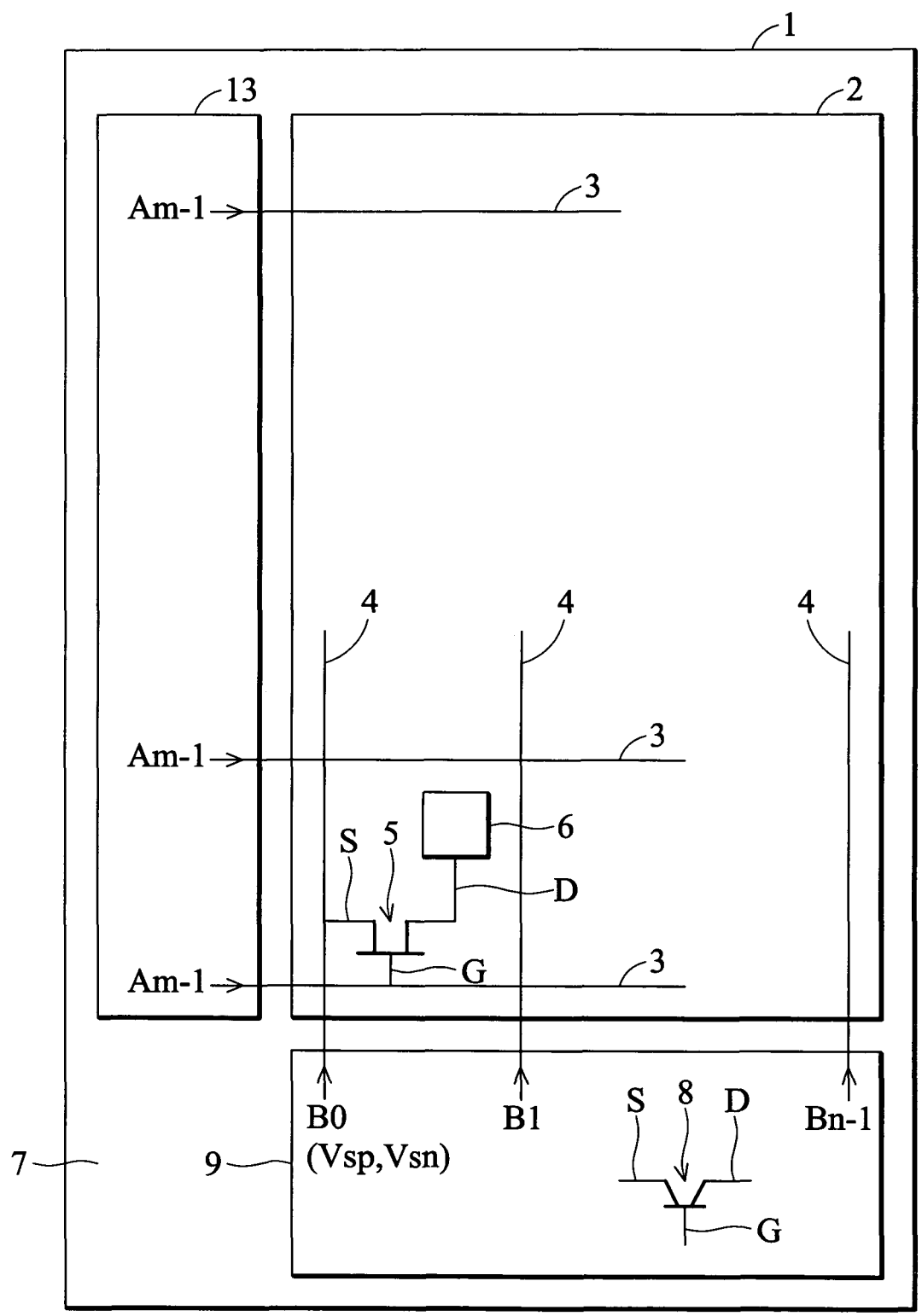
FIG. 1 is a block diagram of a circuit formed on glass substrate.

FIG. 1 is a block diagram of a circuit formed on glass substrate.

Display region 2 and non-display region 7 are disposed on a glass substrate 1. Gate driver 13 is formed in the non-display region 7, having a second circuit portion 12 (referring to FIGS. 3 and 5) as one of its features. First the whole circuit formed on the glass substrate 1 is described hereinafter, and then the second circuit portion 12 (referring to FIGS. 3 and 5) is described.

In display region 2 on the glass substrate 1, m gate lines 3 and n source lines 4 are formed, and TFT (thin film transistor) 5 is formed at intersection of gate line 3 and source line 4. Gate G of TFT 5 is coupled to gate line 3, source S of TFT is coupled to source line 4 and drain D of TFT is coupled to pixel electrode 6. Gate lines 3 receive gate signals A0, A1, ... Am-1 from gate driver 13, drain lines 4 receive gate signals B0, B1, ... Bn-1 from gate driver 9. Each of the gate signals A0, A1, ... Am-1 has alternate voltages of positive gate voltage Vgp and negative gate voltage Vgn. The source signals B0, B1, ... Bn-1 are voltages between positive source voltage Vsp and negative source voltage Vsn. In this embodiment, description uses Vgp=+10V, Vgn=-5V, Vsp=+5V and Vsn=-5V as an example. Vgp, Vgn, Vsp and Vsn can also have other voltage levels. Because positive gate voltage Vgp is +10V and negative gate voltage is -5V, the maximal voltages can be applied between gate G and source S of TFT 5, and between gate G and drain D of TFT 5 are 15V. Thus, TFT 5 is required to have at least withstanding voltages of 15V between gate G and source S, and between gate G and drain D. Further, performance decreases with increased withstanding voltage of TFT. In this embodiment, TFT 5 is designed to have 15V withstanding voltages between gate G and source S, and between gate G and drain D.

Further because positive source voltage Vsp is +5V and negative source voltage is -5V, the maximal voltage applicable between source S and drain D of TFT 5 is 10V. Thus, TFT 5 is designed to have withstanding voltage of 10V between source S and drain D thereof.

TFT 5 has characteristics of withstanding voltage as shown in FIG. 2.

The source driver 9 and the gate driver 13 are formed in the non-display region 7 on the glass substrate 1. The source driver 9 has a plurality of TFTs 8, and here only one TFT 8 is schematically shown in the source driver 9. In this embodiment, TFT 8 and TFT 5 in the display region 2 have the same characteristics of withstanding voltage, as shown in FIG. 2. Thus, TFT 8 will not receive voltage higher than its withstanding voltage, and the source driver 9 can provide voltage between positive source voltage Vp(=5V) and negative source Vn(=-5V) on the source lines 4.

Gate driver 13 is described as follows.

Figure 3:
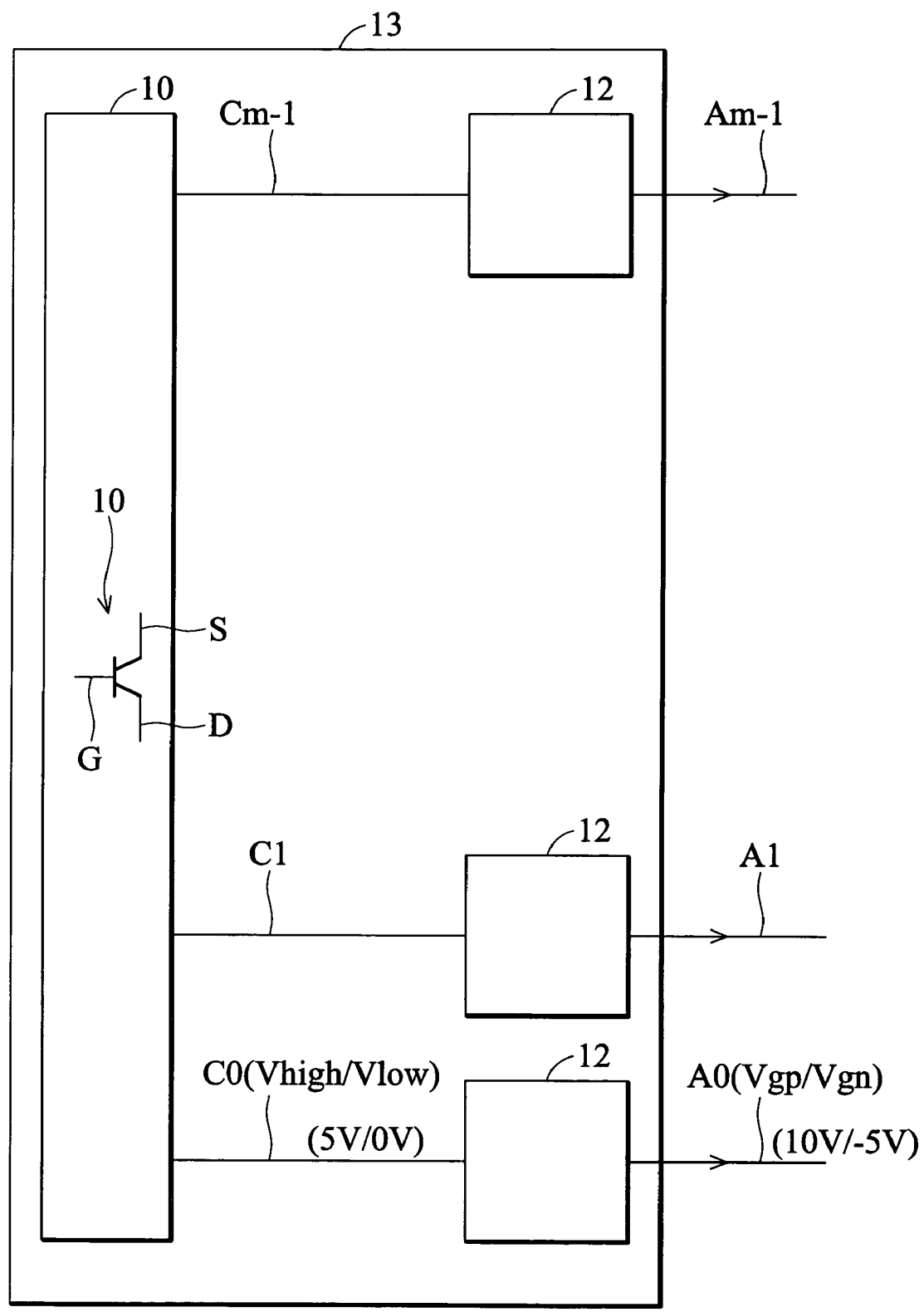
FIG. 3 is a block diagram of the gate driver 13 depicted in FIG. 1.

FIG. 3 is a block diagram of the gate driver 13 depicted in FIG. 1.

The gate driver 13 comprises a first circuit portion 10, the first circuit portion 10 outputs m signals C0, C1, ... Cm-1. Each of the m signals C0, C1, ... Cm-1 has alternate voltages of high voltage level Vhigh and low voltage level Vlow. In this embodiment, description uses Vhigh=5V and Vlow=0V for example. However, Vhigh and Vlow can have another voltage levels. The first circuit portion 10 has a plurality of TFTs 11 (here, only one TFT 11 is shown in the first circuit portion 10). In this embodiment, TFT 11 and TFT 5 in the display region 2 have the same characteristics of withstanding voltage as shown in FIG. 2. Thus, the first circuit portion 10 can output signals C0, C1, ... Cm-1 of voltages Vhigh(=5V) and Vlow (=0V) without imposing voltages higher than withstanding voltage of TFT 11 to TFT 11.

The gate driver 13 has m second circuit portions 12 corresponding to the m signals C0, C1, ... Cm-1. The m second circuit portions 12 receive output signals C0, C1, ... Cm-1, shifting voltage levels of the received signals and outputting the level-shifted signals as gate signals A0, A1, ... Am-1. In this embodiment, the circuit portion 12 outputs positive gate voltage Vgp(=10V) when it receives output signal of Voltage Vhigh(=5V), and outputs negative gate voltage Vgn(=-5V) when it receives output signal of Voltage Vlow(=0V).

Figure 5:
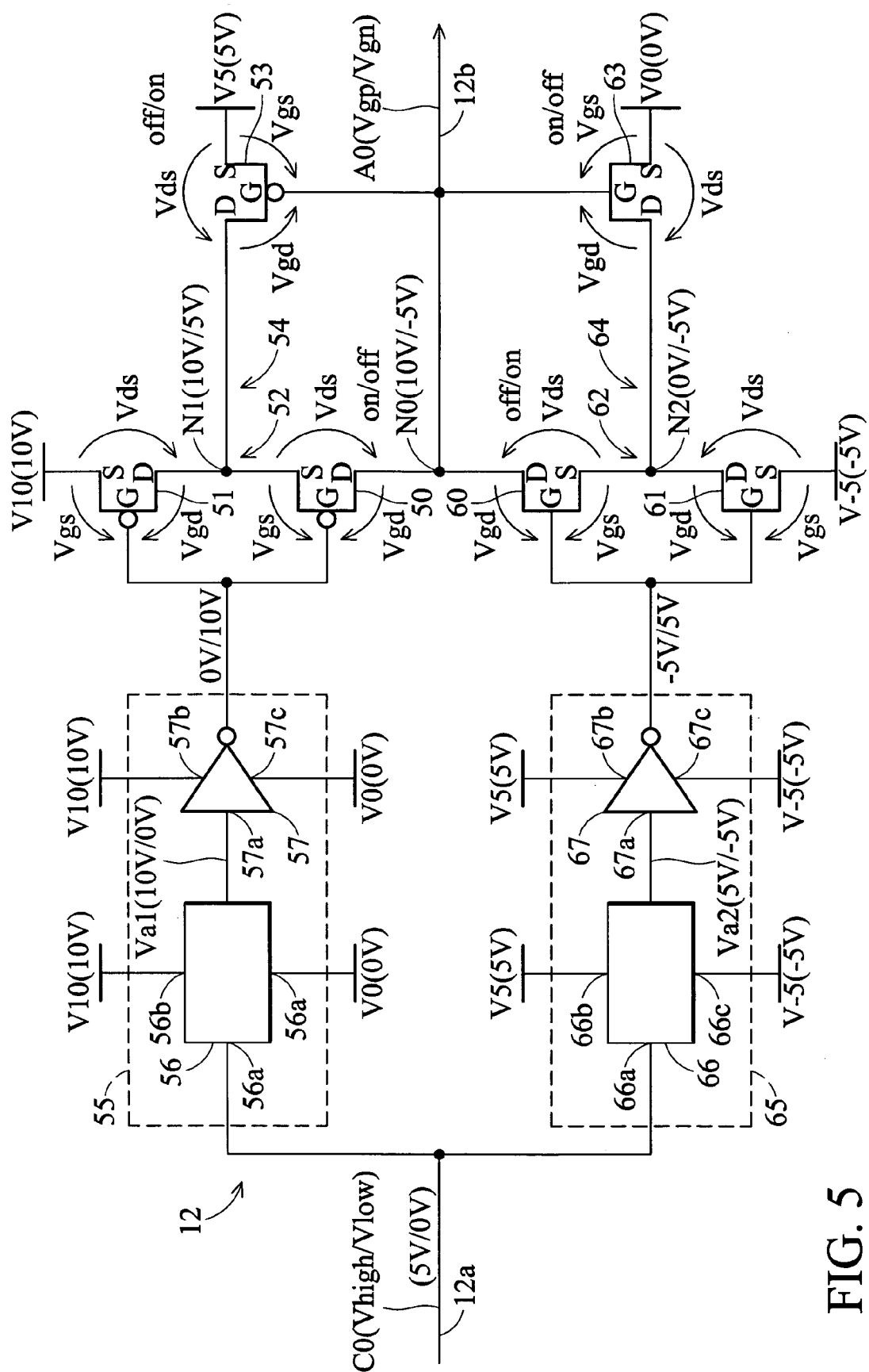
FIG. 5 shows an example of a second circuit portion 12 according to the embodiment.

In this embodiment, the second circuit portion 12 is formed based on circuit configuration shown in FIG. 5, and the second circuit portion 12 based on conventional technology has a different circuit configuration from that of FIG. 5. Configuration of the second circuit portion 12 according to conventional technology is described as follows.

Figure 4:
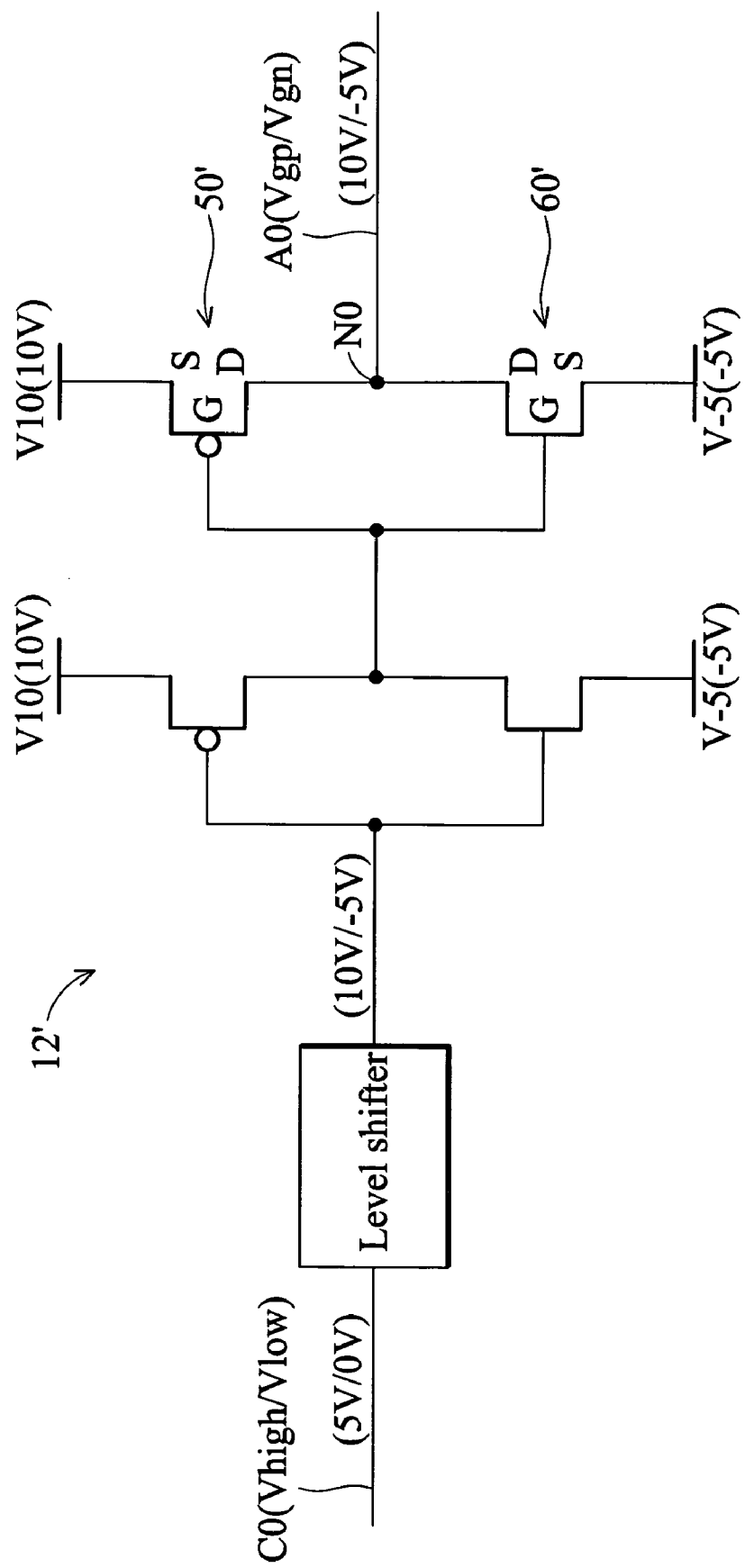
FIG. 4 shows an example of a conventional second circuit portion 12'.

FIG. 4 shows an example of a second circuit portion 12' according to conventional technology.

Voltage difference between the gate positive voltage Vgp (=10V) and the gate negative voltage Vgn(=-5), both output from the second circuit portion 12', is 15V. When the second circuit portion 12' has circuit configuration as shown in FIG. 4, then 15V voltages may be imposed between source S and drain D of TFT 50' and between source S and drain D of TFT 60' respectively. TFT 50' and TFT 60' must respectively have withstanding voltages of at least 15V between sources S and drains D thereof. Thus, the second circuit portion 12' cannot use TFT merely with withstanding voltage of 10V between source S and drain D as shown in FIG. 2. In this situation, TFT 5 (referring to FIG. 2) of withstanding voltage of 10V between source S and drain D is still applied in the display region 2, while TFT 50' and TFT 60' of withstanding voltages of 15V between source S and drain D are applied in the second circuit portion 12'. Thicknesses of insulating films of TFTs have to differ with characteristics of withstanding voltage. Consequently, TFT 5, TFT 50' and TFT 60' cannot be fabricated using the same process, thus required an increased number of fabricating processes.

In this embodiment, the second circuit portion 12 outputting gate positive voltage Vgp(=10V) and gate negative voltage Vgn(=-5V) with voltage difference of 15V utilizes circuit configuration using TFTs of the same withstanding voltage characteristics as TFT 5 (referring to FIG. 2). The configuration of the second circuit portion 12 is described hereinafter.

FIG. 5 shows an example of a second circuit portion 12 according to an embodiment.

Among m second circuit portions 12 of the gate driver 13, the second circuit portion 12 which receives output signal C0 (referring to FIG. 3) and outputs gate signal A0 is described as follows, and the other second circuit portions 12 have the same description.

The second circuit portion 12 has an input portion 12a for receiving output signal C0 from the first circuit portion 10 (referring to FIG. 3). The output signal C0 has voltage 5V or 0V, and thus input portion 12a receives 5V or 0V voltage. The second circuit portion 12 receives 5V voltage and outputs 10V voltage from output portion 12b, and receives 0V voltage and outputs -5V voltage from output portion 12b. The output portion 12b of the second circuit portion 12 receives power supply voltage $V_{10}$ (=10V) through a node N0 and a first route 52 of P-type TFTs 50 and 51 so as to output 10V voltage. In addition, the output portion 12b of the second circuit portion 12 receives power supply voltage $V_{-5}$ (=-5V) through the node N0 and a second route 62 of N-type TFTs 60 and 61 so as to output -5V voltage.

P-type TFT 50 is disposed on the first route 52, and N-type TFT 60 is disposed on the second route 62. TFTs 50 and 60 have the same characteristics of withstanding voltage shown in FIG. 2. Drains D of the TFTs 50 and 60 are coupled to the node N0. It is noted that not only TFT 50 but also P-type TFT 51 is disposed on the first route 52. The power supply voltage $V_{10}$ is provided to the node N0 through TFTs 51 and 50. It is also noted that that not only N-type TFT 60 but also N-type TFT 61 is disposed on the second route 62. The power supply voltage $V_{-5}$ is provided to the node N0 through TFTs 61 and 60. The circuits shown in FIGS. 5 and 4 are different. In FIG. 4, power supply voltage $V_{10}$ is provided to the node N0 merely through TFT 50' and power supply voltage $V_{-5}$ is provided to the node N0 merely through TFT 60'.

It is further noted that the node N1 between the TFT 50 and 51 receives power supply voltage $V_5$ (=5V) through a third route 54, and the node N2 between the TFT 60 and 61 receives power supply voltage $V_0$ (=0V) through a fourth route 64. P-type TFT 53 is disposed on the third route 54 and N-type TFT 63 is disposed on the fourth route 64. Gates G of the TFTs 53 and 63 are coupled to the node N0 (output portion 12b). Reasons about node N1 receiving power supply voltage $V_5$ through the TFT 53 and node N2 receiving power supply voltage $V_0$ through the TFT 63 will be described hereinafter.

When the second circuit portion 12 outputs 10V voltage, the TFTs 50 and 51 turn on and the TFTs 60 and 61 turn off. Thereby, power supply voltage $V_{10}$ is provided to the node N0 and the power supply voltage $V_{-5}$ is not provided to the node N0, and as a result the second circuit portion 12 outputs 10V voltage. Also, when the second circuit portion 12 outputs −5V voltage, the TFTs 50 and 51 turn off and the TFTs 60 and 61 turn on. Thereby, power supply voltage $V_{-5}$ is provided to the node N0 and the power supply voltage $V_{10}$ is not provided to the node N0, and as a result the second circuit portion 12 outputs −5V voltage. To make TFTs 50, 51, 60 and 61 perform turn-on and turn-off operations as described, the second circuit portion 12 has a control portion 55 controlling voltage levels at gates G of the TFTs 50 and 51, and a control portion 65 controlling voltage levels at gates G of the TFTs 60 and 61.

The control portion 55 comprises a level shifter 56 and an inverter 57. The level shifter 56 receives voltage Vhigh (=5V)/ Vlow(=0V) from the input portion 12a of the second circuit portion 12 through an input terminal 56a. Also, the level shifter 56 receives power supply voltage $V_{10}$ through a first terminal 56b and power supply voltage $V_0$ through a second terminal 56c. When the level shifter 56 receives 5V voltage through the input terminal 56a, it outputs 10V voltage, and when the level shifter 56 receives 0V voltage through the input terminal 56a, it outputs 0V voltage. The inverter 57 receives output voltage (10V/0V) from the level shifter 56 through an input terminal 57a, receives power supply voltage $V_{10}$ through a first terminal 57b, and receives power supply voltage $V_0$ through a second terminal 57c. The inverter 57 outputs 0V voltage when receiving 10V voltage from the level shifter 56, and outputs 10V voltage when receiving 0V voltage from the level shifter 56.

The control portion 65 comprises a level shifter 66 and an inverter 67. The level shifter 66 receives voltage Vhigh (=5V)/ Vlow(=0V) from the input portion 12a of the second circuit portion 12 through an input terminal 66a. Also, the level shifter 66 receives power supply voltage $V_5$ through a first terminal 66b and power supply voltage $V_{-5}$ through a second terminal 66c. When the level shifter 66 receives 5V voltage through the input terminal 66a, it outputs 5V voltage, and when the level shifter 66 receives 0V voltage through the input terminal 66a, it outputs −5V voltage. The inverter 67 receives output voltage (5V/−5V) from the level shifter 66 through an input terminal 67a, receives power supply voltage $V_5$ through a first terminal 67b, and receives power supply voltage $V_{-5}$ through a second terminal 67c. The inverter 67 outputs −5V voltage when receiving 5V voltage from the level shifter 66, and outputs 5V voltage when receiving −5V voltage from the level shifter 66.

TFTs in the second circuit portion 12 have the same characteristics of withstanding voltage as shown in FIG. 2. Threshold voltages of N-type TFTs in the second circuit portion 12 are about 2V, and threshold voltages of P-type TFTs in the second circuit portion 12 are about −2V.

The second circuit portion 12 with this configuration performs operations as follows, after receiving 5V and 0V voltage from the input portion 12a. The operation when the second circuit portion 12 receiving 5V voltage from the input portion 12a is first described, and the operation when the second circuit portion 12 receiving 0V voltage from the input portion 12a is subsequently described.

(1) Circuit Operation When the Second Circuit Portion 12 Receives 5V Voltage From the Input Portion 12a:

When the input portion 12a receives voltage Vhigh (=5V), the 5V voltage is supplied to the control portions 55 and 65.

When the control portion 55 receives 5V voltage, the 5V voltage is input to the level shifter 56. The level shifter 56 outputs 10V voltage Va1 after receiving 5V voltage. The level shifter 56 receives 5V voltage through the input terminal 56a, respectively receives power supply voltages $V_{10}$ (=10V) and $V_0$ (=0V) through the first and second terminals 56b and 56c. In this state, difference between the voltage Vhigh (=5V) and the power supply voltage $V_{10}$ (=10V) is 5V, difference between the voltage Vhigh (=5V) and the power supply voltage $V_0$ (=0V) is 5V, and difference between the voltage $V_{10}$ (=10V) and the power supply voltage $V_0$ (=0V) is 10V. Voltages thus imposed at gate-source, gate-drain and drain-source of TTFs (not shown) in the level shifter 56 are not more than 10V, and thus do not exceed the TFT withstanding voltages as shown in FIG. 2.

The inverter 57 inversely converts 10V voltage Va1 output from the level shifter 56 and outputs 0V voltage. The inverter 57 receives 10V voltage through the input terminal 57a, and power supply voltages $V_{10}$ and $V_0$ respectively through the first and second terminals 57b and 57c. In this state, difference between the voltage Va1 (=10V) at the input terminal 57a and the power supply voltage $V_{10}$ (=10V) is 0V, difference between the voltage Va1 (=10V) and the power supply voltage $V_0$ (=0V) is 10V, and difference between the voltage $V_{10}$ (=10V) and the power supply voltage $V_0$ (=0V) is 10V. Thus, voltages imposed at gate-source, gate-drain and drain-source of TTFs (not shown) in the inverter 57 are not more than 10V, and thus do not exceed the TFT withstanding voltages as shown in FIG. 2.

0V voltage output from the inverter 57 is provided to the TFTs 50 and 51. The TFT 51 receives power supply voltage $V_{10}$ (=10V) through source S, and thus gate-source voltage Vgs of the TFT 51 is −10V. The TFT 51 turns on because its threshold voltage Vth is about −2V. Power supply voltage $V_{10}$ is provided to the node N1 due to turning on of the TFT 51, and thus voltage Vn1 at the node N1 becomes 10V. TFT 50 also turns on because gate-source voltage Vgs thereof becomes −10V. Thus, power supply voltage $V_{10}$ is provided to the node N0 due to both turning on of the TFTs 50 and 51. It is noted that due to both turning on of the TFTs 50 and 51, power supply voltage $V_{10}$ is provided to the gate G of the TFT 53 through the TFT 51, TFT 50 and the node N0. Hence, gate-drain voltage Vgd of the TFT 53 becomes 0V, and gate-source voltage Vgs of the TFT 53 becomes 5V. The TFT 53 turns off because its threshold voltage Vth is about −2V. Supply of power supply voltage $V_5$ to node N1 is cut off due to turning off of TFT 53. As a result, power supply voltage $V_{10}$ is provided to node N1, but not power voltage $V_5$. Gate-source voltages Vgs, gate-drain voltages Vgd and drain-source voltages Vds of TFTs 50, 51 and 53 are shown in FIG. 6.

FIG. 6 shows voltages Vgs, Vgd and Vds of TFTs 50, 51 and 53 when the second circuit portion 12 receives 5V voltage from the input portion 12a.

As shown in FIG. 6, absolute values of voltages Vgs, Vgd and Vds of TFTs 50, 51 and 53 are below 10V. Voltages imposed to TFTs 50, 51 and 53 do not exceed withstanding voltages (referring to FIG. 2) of TFTs 50, 51 and 53.

When the control portion 65 receives 5V voltage, the 5V voltage is input to the level shifter 66. The level shifter 66 outputs 5V voltage Va2 after receiving 5V voltage. The level shifter 66 receives 5V voltage through the input terminal 66*a*, respectively receives power supply voltages $V_5$ (=5V) and $V_{-5}$ (=−5V) through the first and second terminals 66*b* and 66*c*. In this state, difference between the voltage Vhigh (=5V) at the input terminal 66*a* and the power supply voltage $V_5$ (=5V) is 0V, difference between the voltage Vhigh (=5V) and the power supply voltage $V_{-5}$ (=−5V) is 10V, and difference between the voltage $V_5$ (=5V) and the power supply voltage $V_{-5}$ (=−5V) is 10V. Thus, voltages imposed at gate-source, gate-drain and drain-source of TTFs (not shown) in the level shifter 66 are not more than 10V, and thus do not exceed the TFT withstanding voltages as shown in FIG. 2.

The inverter 67 inversely converts 5V voltage Va2 output from the level shifter 66 and outputs −5V voltage. The inverter 67 receives 5V voltage through the input terminal 67*a*, and power supply voltages $V_5$ and $V_{-5}$ respectively through the first and second terminals 67*b* and 67*c*. In this state, difference between the voltage Va2 (=5V) at the input terminal 67*a* and the power supply voltage $V_5$ (=5V) is 0V, difference between the voltage Va2 (=5V) and the power supply voltage $V_{-5}$ (=−5V) is 10V, and difference between the voltage $V_5$ (=5V) and the power supply voltage $V_{-5}$ (=−5V) is 10V. Thus, voltages imposed at gate-source, gate-drain and drain-source of TTFs (not shown) in the inverter 67 are not more than 10V, not exceed the TFT withstanding voltages as shown in FIG. 2.

−5V voltage output from the inverter 67 is provided to the TFTs 60 and 61. The TFT 61 receives power supply voltage $V_{-5}$ (=−5V) through source S, and thus gate-source voltage Vgs of the TFT 61 is 0V. It is noted that both TFTs 51 and 50 turn on as described. Due to turning-on of TFTs 51 and 50, power supply voltage $V_{10}$ (=10V) is provided to gate G of TFT 63 through TFTs 51, 50 and node N0. Gate-source voltage Vgs of TFT 63 is 10V and threshold voltage of TFT 63 is about 2V, and thus TFT 63 turns on. Power supply voltage $V_0$ (=0V) is provided to the node N2 due to turning-on of the TFT 63, and thus voltage Vn2 at the node N2 becomes 0V. Thus, Gate-drain voltage Vgd of TFT 61 becomes −5V. As a result, Gate-source voltage Vgs of TFT 61 becomes 0V and gate-drain voltage Vgd of TFT 61 becomes −5V. TFT 61 turns off because its threshold voltage Vth is about 2V.

Also, TFT 60 receives −5V voltage output from the control portion 65. Gate-source voltage Vgs of TFT 60 is −5V because voltage Vn2 at node N2 is 0V. Both TFTs 51 and 50 turn on as described, and therefore power supply voltage $V_{10}$ (=10V) is provided to drain D of TFT 60 through TFTs 51, 50 and node N0. Thus, gate-drain voltage Vgd of TFT 60 is −15V. As a result, Gate-source voltage Vgs of TFT 60 becomes −5V and gate-drain voltage Vgd of TFT 60 becomes −15V. TFT 60 turns off because its threshold voltage Vth is about 2V. Supplies of power supply voltage $V_{-5}$ (=−5V) and $V_0$ (=0V) to node N0 are cut off due to turning off of TFT 60. Gate-source voltages Vgs, gate-drain voltages Vgd and drain-source voltages Vds of TFTs 60, 61 and 63 are shown in FIG. 7.

FIG. 7 shows voltages Vgs, Vgd and Vds of TFTs 60, 61 and 63 when the second circuit portion 12 receives 5V voltage from the input portion 12*a*.

As shown in FIG. 7, absolute values of voltages Vgs and Vgd of TFTs 60, 61 and 63 are below 10V, and absolute values of voltages Vgd of TFTs 60, 61 and 63 are below 15V. Thus, Voltages imposed to TFTs 60, 61 and 63 do not exceed withstanding voltages (referring to FIG. 2) of TFTs 60, 61 and 63.

Accordingly, power supply voltage $V_{10}$ (=10V) is supplied to node N0, but power supply voltages $V_5$ (=5V), $V_0$ (=0V) and $V_{-5}$ (=−5V) are not. The second circuit portion 12 outputs 10V voltage from the output portion 12*b*.

The second circuit portion 12 outputs 10V voltage from output portion 12*b*. Thus, difference between the voltage (−5V) at source S of TFT 61 and the voltage (10V) at the node N0 is 15V, and withstanding voltage between drain and source of each TFTs 60 and 61 is only 10V (referring to FIG. 2). In this embodiment, it is noted that TFT 63 turns on when the second circuit portion 12 outputs 10V voltage, and therefore power supply voltage $V_0$ is supplied to node N2. As a result, voltage Vn2 at node N2 is held at $V_0$ (=0V), voltage Vds of TFT 60 is held at 10V and voltage Vds of TFT 61 is held at 5V, preventing voltages imposed at drain-source of TFT 61 and drain-source of TFT 60 from exceeding withstanding voltages (referring to FIG. 2) of TFTs 60 and 61.

The second circuit portion 12 outputs 10V voltage after receiving 5V voltage, without violating requirement of withstanding voltages (referring to FIG. 2).

(2) Circuit Operation When the Second Circuit Portion 12 Receives 0V Voltage From the Input Portion 12*a*:

When the input portion 12*a* receives voltage Vlow (=0V), the 0V voltage is supplied to the control portions 55 and 65.

When the control portion 65 receives 0V voltage, the 0V voltage is input to the level shifter 66. The level shifter 66 outputs −5V voltage Va2 after receiving 0V voltage. The level shifter 66 receives 0V voltage through the input terminal 66*a*, respectively receives power supply voltages $V_5$ (=5V) and $V_{-5}$ (=−5V) through the first and second terminals 66*b* and 66*c*. In this state, difference between the voltage Vlow (=0V) and the power supply voltage $V_5$ (=5V) is 5V, difference between the voltage Vlow (=0V) and the power supply voltage $V_{-5}$ (=−5V) is 5V, and difference between the voltage $V_5$ (=5V) and the power supply voltage $V_{-5}$ (=−5V) is 10V. Thus, voltages imposed at gate-source, gate-drain and drain-source of TTFs (not shown) in the level shifter 66 are not more than 10V, and thus do not exceed the TFT withstanding voltages as shown in FIG. 2.

The inverter 67 inversely converts −5V voltage Va2 output from the level shifter 66 and outputs 5V voltage. The inverter 67 receives −5V voltage through the input terminal 67*a*, and power supply voltages $V_5$ and $V_{-5}$ respectively through the first and second terminals 67*b* and 67*c*. In this state, difference between the voltage Va2 (=−5V) at the input terminal 67*a* and the power supply voltage $V_5$ (=5V) is 10V, difference between the voltage Va2 (=−5V) and the power supply voltage $V_{-5}$ (=−5V) is 10V, and difference between the voltage $V_5$ (=5V) and the power supply voltage $V_{-5}$ (=−5V) is 10V. Thus, voltages imposed at gate-source, gate-drain and drain-source of TTFs (not shown) in the inverter 67 are not more than 10V, and thus do not exceed the TFT withstanding voltages as shown in FIG. 2.

5V voltage output from the inverter 67 is provided to the TFTs 60 and 61. The TFT 61 receives power supply voltage $V_{-5}$ (=−5V) through source S, and thus gate-source voltage Vgs of the TFT 61 is 10V. The TFT 61 turns on because its threshold voltage Vth is about 2V. Power supply voltage $V_{-5}$ is provided to the node N2 due to turning-on of the TFT 61, and thus voltage Vn2 at the node N2 becomes −5V. TFT 60 also turns on because gate-source voltage Vgs thereof becomes 10V. Thus, power supply voltage $V_{-5}$ is provided to the node N0 due to turning-on of the TFTs 60 and 61. It is noted that due to both turning-on of the TFTs 60 and 61, power supply voltage $V_{-5}$ is provided to the gate G of the TFT 63 through the TFT 61, TFT 60 and the node N0. Hence, gate-drain voltage Vgd of the TFT 63 becomes 0V, gate-source voltage Vgs of the TFT 63 becomes −5V. The TFT 63 turns off because its threshold voltage Vth is about 2V. Supply of power supply voltage $V_0$ to node N2 is cut off due to turning-off of TFT 63. As a result, power supply voltage $V_{-5}$ is provided to node N2, but not power voltage $V_0$. Gate-source voltages Vgs, gate-drain voltages Vgd and drain-source voltages Vds of TFTs 60, 61 and 63 are shown in FIG. 8.

FIG. 8 shows voltages Vgs, Vgd and Vds of TFTs 60, 61 and 63 when the second circuit portion 12 receives 0V voltage from the input portion 12a.

As shown in FIG. 8, absolute values of voltages Vgs, Vgd and Vds of TFTs 60, 61 and 63 are below 10V. Voltages imposed to TFTs 60, 61 and 63 do not exceed withstanding voltages (referring to FIG. 2) of TFTs 60, 61 and 63.

When the control portion 55 receives 0V voltage, the 0V voltage is input to the level shifter 56. The level shifter 56 outputs 0V voltage Va1 after receiving 0V voltage. The level shifter 56 receives 0V voltage through the input terminal 56a, respectively receives power supply voltages $V_{10}$ (=10V) and $V_0$ (=0V) through the first and second terminals 56b and 56c. In this state, difference between the voltage Vlow (=0V) at the input terminal 56a and the power supply voltage $V_0$ (=0V) is 0V, difference between the voltage Vlow (=0V) and the power supply voltage $V_0$ (=0V) is 0V, and difference between the voltage $V_{10}$ (=10V) and the power supply voltage $V_0$ (=0V) is 10V. Thus, voltages imposed at gate-source, gate-drain and drain-source of TTFs (not shown) in the level shifter 56 are not more than 10V, and thus do not exceed the TFT withstanding voltages as shown in FIG. 2.

The inverter 57 inversely converts 0V voltage Va1 output from the level shifter 56 and outputs 10V voltage. The inverter 57 receives 0V voltage through the input terminal 57a, and power supply voltages $V_{10}$ and $V_0$ respectively through the first and second terminals 57b and 57c. In this state, difference between the voltage Va1 (=0V) at the input terminal 57a and the power supply voltage $V_{10}$ (=5V) is 10V, difference between the voltage Va1 (=0V) and the power supply voltage $V_0$ (=0V) is 0V, and difference between the voltage $V_{10}$ (=10V) and the power supply voltage $V_0$ (=0V) is 10V. Thus, voltages imposed at gate-source, gate-drain and drain-source of TTFs (not shown) in the inverter 57 are not more than 10V, and thus do not exceed the TFT withstanding voltages as shown in FIG. 2.

10V voltage output from the inverter 57 is provided to the TFTs 50 and 51. The TFT 51 receives power supply voltage $V_{10}$ (=10V) through source S, and thus gate-source voltage Vgs of the TFT 51 is 0V. It is noted that both TFTs 61 and 60 turn on as described. Due to turning-on of TFTs 61 and 60, power supply voltage $V_{-5}$ (=−5V) is provided to gate G of TFT 53 through TFTs 61, 60 and node N0. Gate-source voltage Vgs of TFT 53 is −10V and threshold voltage of TFT 53 is about −2V, and thus TFT 53 turns on. Power supply voltage $V_5$ (=5V) is provided to the node N1 due to turning-on of the TFT 53, and thus voltage Vn1 at the node N1 becomes 5V. Thus, Gate-drain voltage Vgd of TFT 51 becomes 5V. As a result, Gate-source voltage Vgs of TFT 51 becomes 0V and gate-drain voltage Vgd of TFT 51 becomes 5V. TFT 51 turns off because its threshold voltage Vth is about −2V.

Also, TFT 50 receives 10V voltage output from the control portion 55. Gate-source voltage Vgs of TFT 50 is 5V because voltage Vn1 at node N1 is 5V. Both TFTs 61 and 60 turn on as described, and therefore power supply voltage $V_{-5}$ (=10V) is provided to drain D of TFT 50 through TFTs 61, 60 and node N0. Thus, gate-drain voltage Vgd of TFT 50 is 15V. As a result, gate-source voltage Vgs of TFT 50 becomes 5V and gate-drain voltage Vgd of TFT 50 becomes 15V. TFT 50 turns off because its threshold voltage Vth is about −2V. Supplies of power supply voltage V10 (=10V) and $V_5$ (=5V) to node N0 are cut off due to turning-off of TFT 50. Gate-source voltages Vgs, gate-drain voltages Vgd and drain-source voltages Vds of TFTs 50, 51 and 53 are shown in FIG. 9.

FIG. 9 shows voltages Vgs, Vgd and Vds of TFTs 50, 51 and 53 when the second circuit portion 12 receives 0V voltage from the input portion 12a.

As shown in FIG. 9, absolute values of voltages Vgs and Vgd of TFTs 50, 51 and 53 are below 10V, and absolute values of voltages Vgd of TFTs 50, 51 and 53 are below 15V. Thus, voltages imposed to TFTs 50, 51 and 53 do not exceed withstanding voltages (referring to FIG. 2) of TFTs 60, 61 and 63.

Accordingly, power supply voltage $V_{-5}$ (=−5V) is supplied to node N0, but power supply voltages $V_{10}$ (=10V), $V_5$ (=5V) and $V_0$ (=0V) are not. The second circuit portion 12 outputs −5V voltage from the output portion 12b, as a result.

The second circuit portion 12 outputs −5V voltage from output portion 12b. Thus, difference between the voltage (10V) at source S of TFT 51 and the voltage (−5V) at the node N0 is 15V, and withstanding voltage between drain and source of each TFTs 50 and 51 is only 10V (referring to FIG. 2). In this embodiment, it is noted that TFT 53 turns on when the second circuit portion 12 outputs −5V voltage from the output portion 12b, and therefore power supply voltage $V_5$ (=5V) is supplied to node N1. As a result, voltage Vn1 at node N1 is held at $V_5$ (=5V), voltage Vds of TFT 50 is held at −10V and voltage Vds of TFT 51 is held at −5V, preventing voltages imposed at drain-source of TFT 50 and drain-source of TFT 51 from exceeding withstanding voltages (referring to FIG. 2) of TFTs 50 and 51.

The second circuit portion 12 outputs −5V voltage after receiving 0V voltage, without violating requirement of withstanding voltages (referring to FIG. 2).

In this embodiment, TFTs of the second circuit portion 12 have the same characteristics of withstanding voltage as that of TFTs 5 in the display region 2 (referring to FIG. 1), TFTs 8 in the source driver 9 (referring to FIG. 1) and TFTs 11 in the first circuit portion 10 (referring to FIG. 3). Thus, all TFTs can be fabricated on the glass substrate 1 (referring to FIG. 1) in similar size, whereby fabricating the TFTs by the same process and reducing manufacturing cost and number of processes.

In addition, the control portions 55 and 65 in FIG. 5 receive output signal C0 from the first circuit portion 10. The control portion 55 controls voltages at gate G of TFTs 50 and 51, and the control portion 65 controls voltages at gate G of TFTs 60 and 61. However, the control portions 55 and 65 can receives other signals to control voltages at gate G of TFTs.

In addition, the control portions 55 and 65 are used to control voltages at gates G of TFTs 50, 51, 60 and 61, and other circuits can also be used to control the TFTs.

Subsequently, another embodiment of the second circuit portion is described.

Figure 10:
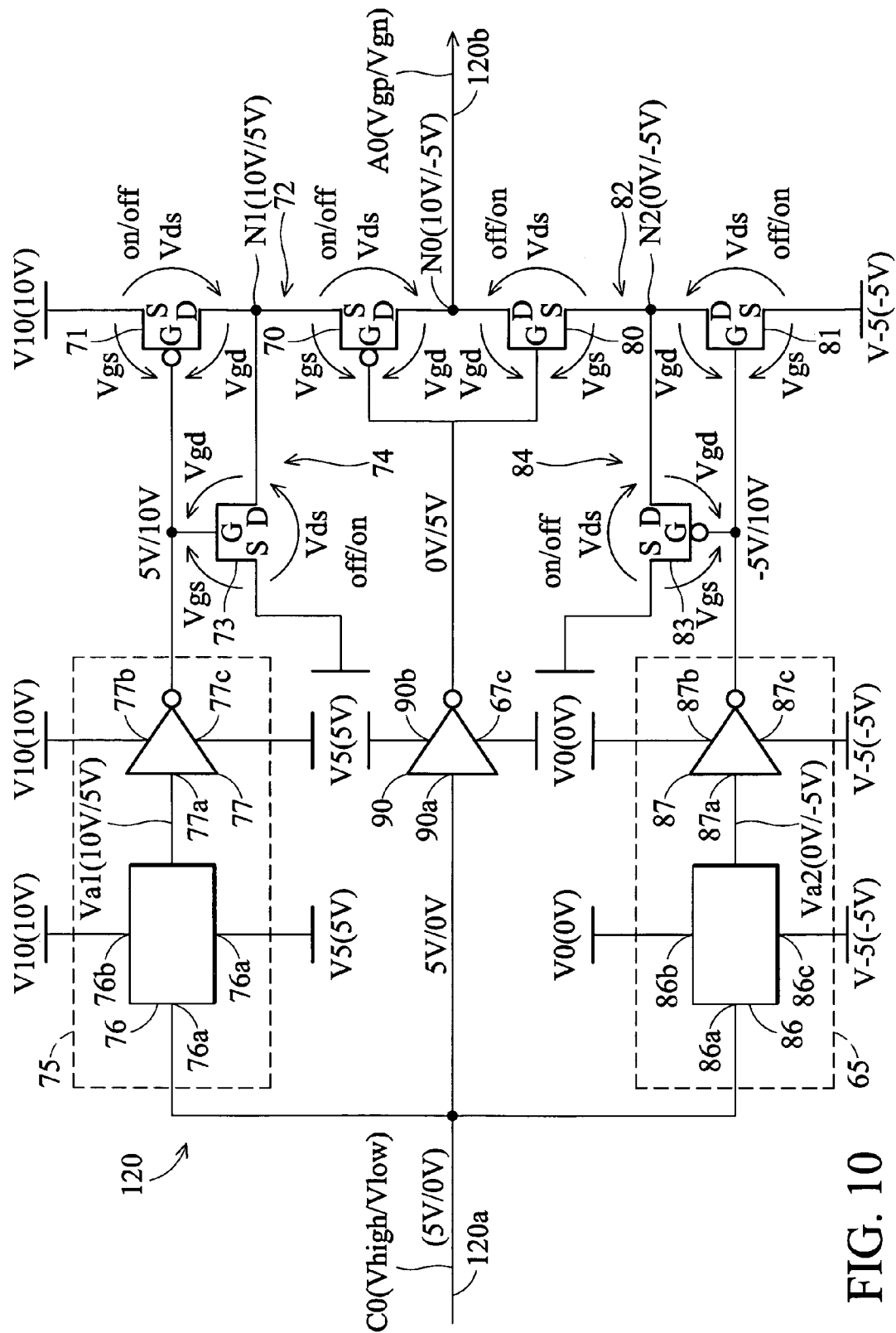
FIG. 10 shows a second circuit portion 120 according to another embodiment of the invention.

FIG. 10 shows a second circuit portion 120 according to another embodiment of the invention.

The second circuit portion 120 in FIG. 10, like the second circuit portion 12 in FIG. 5, outputs 10V voltage when receiving 5V voltage, and outputs −5V voltage when receiving 0V voltage.

The output portion 120b of the second circuit portion 120 receives power supply voltage $V_{10}$ (=10V) through a node N0 and a first route 72 of P-type TFTs 70 and 71 so as to output 10V voltage. In addition, the output portion 120b of the second circuit portion 120 receives power supply voltage $V_{-5}$ (=−5V) through the node N0 and a second route 82 of N-type TFTs 80 and 81 so as to output −5V voltage.

P-type TFT 70 is disposed on the first route 72, and N-type TFT 80 is disposed on the second route 82. TFTs 70 and 80 have the same characteristics of withstanding voltage as shown in FIG. 2. Drains D of the TFTs 70 and 80 are coupled to the node N0. It is noted that not only TFT 70 but also P-type TFT 71 is disposed on the first route 72. The power supply voltage $V_{10}$ is provided to the node N0 through TFTs 71 and 70. It is also noted that that not only N-type TFT 80 but also N-type TFT 81 is disposed on the second route 82. The power supply voltage $V_{-5}$ is provided to the node N0 through TFTs 81 and 80.

It is further noted that the node N1 between the TFTs 70 and 71 receives power supply voltage $V_5$ (=5V) through a third route 74, and the node N2 between the TFTs 80 and 81 receive power supply voltage $V_0$ (=0V) through a fourth route 84. N-type TFT 73 is disposed on the third route 74 and P-type TFT 83 is disposed on the fourth route 84. Reasons about node N1 receiving power supply voltage $V_5$ through the TFT 73 and node N2 receiving power supply voltage $V_0$ through the TFT 83 will be described hereinafter.

When the second circuit portion 120 outputs 10V voltage, the TFTs 70 and 71 turn on and the TFTs 80 and 81 turn off. Thereby, power supply voltage $V_{10}$ is provided to the node N0 and the power supply voltage $V_{-5}$ is not provided to the node N0, and as a result the second circuit portion 120 outputs 10V voltage. Also, when the second circuit portion 120 outputs −5V voltage, the TFTs 70 and 71 turn off and the TFTs 80 and 81 turn on. Thereby, power supply voltage $V_{-5}$ is provided to the node N0 and the power supply voltage $V_{10}$ is not provided to the node N0, and as a result the second circuit portion 120 outputs −5V voltage. To make TFTs 70, 71, 80 and 81 perform turn-on and turn-off operations as described, the second circuit portion 120 has a control portion (or inverter) 90 controlling voltage levels at gates G of the TFTs 70 and 80, a control portion 75 controlling voltage levels at gates G of the TFT 71, and a control portion 85 controlling voltage levels at gates G of the TFT 81.

The inverter 90 is coupled to TFTs 70 and 80. The inverter 90 receives Vhigh (=5V)/Vlow (=0V) through an input terminal 90a, receives power supply voltage $V_5$ (=5V) through a first terminal 90a, and receives power supply voltage $V_0$ (=0V) through a second terminal 90c. The inverter 90 outputs 0V voltage when receiving 5V voltage and outputs 0V voltage when receiving 0V voltage.

The control portion 75 comprises a level shifter 76 and an inverter 77. The level shifter 76 receives voltage Vhigh (=5V)/Vlow(=0V) through an input terminal 76a. Also, the level shifter 76 receives power supply voltage $V_{10}$ through a first terminal 76b and power supply voltage $V_5$ through a second terminal 76c. When the level shifter 76 receives 5V voltage through the input terminal 76a, it outputs 10V voltage, and when the level shifter 76 receives 0V voltage through the input terminal 76a, it outputs 5V voltage. The inverter 77 receives output voltage (10V/5V) from the level shifter 76 through an input terminal 77a, receives power supply voltage $V_{10}$ through a first terminal 77b, and receives power supply voltage $V_5$ through a second terminal 77c. The inverter 77 outputs 5V voltage when receiving 10V voltage from the level shifter 76, and outputs 10V voltage when receiving 5V voltage from the level shifter 76. The control portion 75 is coupled to gates G of TFTs 71 and 73 to control voltage levels at gates G of the TFTs 71 and 73.

The control portion 85 comprises a level shifter 86 and an inverter 87. The level shifter 86 receives voltage Vhigh (=5V)/ Vlow(=0V) through an input terminal 86a. Also, the level shifter 86 receives power supply voltage $V_0$ through a first terminal 86b and power supply voltage $V_{-5}$ through a second terminal 86c. When the level shifter 86 receives 5V voltage through the input terminal 86a, it outputs 0V voltage, and when the level shifter 86 receives 0V voltage through the input terminal 86a, it outputs −5V voltage. The inverter 87 receives output voltage (0V/−5V) from the level shifter 86 through an input terminal 87a, receives power supply voltage $V_0$ through a first terminal 87b, and receives power supply voltage $V_{-5}$ through a second terminal 87c. The inverter 87 outputs −5V voltage when receiving 0V voltage from the level shifter 86, and outputs 0V voltage when receiving −5V voltage from the level shifter 86. The control portion 85 is coupled to gates G of TFTs 81 and 83 to control voltage levels at gates G of the TFTs 81 and 83

TFTs in the second circuit portion 120 have the same characteristics of withstanding voltage as shown in FIG. 2. Threshold voltages of N-type TFTs in the second circuit portion 120 are about 2V, and threshold voltages of P-type TFTs in the second circuit portion 120 are about −2V.

The second circuit portion 120 with this configuration performs operations as follows, after receiving 5V and 0V voltage from the input portion 120a. The operation when the second circuit portion 120 receiving 5V voltage from the input portion 120a is first described, and the operation when the second circuit portion 120 receiving 0V voltage from the input portion 120a is subsequently described.

(1) Circuit Operation When the Second Circuit Portion 120 Receives 5V Voltage From the Input Portion 120a:

When the input portion 120a receives voltage Vhigh (=5V), the 5V voltage is supplied to the control portions 75, 90 and 85.

When the control portion 75 receives 5V voltage, the 5V voltage is input to the level shifter 76. The level shifter 76 outputs 10V voltage Va1 after receiving 5V voltage. The level shifter 76 receives 5V voltage through the input terminal 76a, and respectively receives power supply voltages $V_{10}$ (=10V) and $V_5$ (=5V) through the first and second terminals 76b and 76c. In this state, difference between the voltage Vhigh (=5V) and the power supply voltage $V_{10}$ (=10V) is 5V, difference between the voltage Vhigh (=5V) and the power supply voltage $V_5$ (=5V) is 0V, and difference between the voltage $V_{10}$ (=10V) and the power supply voltage $V_5$ (=5V) is 5V. Thus, voltages imposed at gate-source, gate-drain and drain-source of TTFs (not shown) in the level shifter 76 are not more than 5V, and thus do not exceed the TFT withstanding voltages as shown in FIG. 2.

The inverter 77 inversely converts 10V voltage Va1 output from the level shifter 76 and outputs 5V voltage. The inverter 77 receives 10V voltage through the input terminal 77a, and power supply voltages $V_{10}$ and $V_5$ respectively through the first and second terminals 77b and 77c. In this state, difference between the voltage Va1 (=10V) at the input terminal 77a and the power supply voltage $V_{10}$ (=10V) is 0V, difference between the voltage Va1 (=10V) and the power supply voltage $V_5$ (=5V) is 5V, and difference between the voltage $V_{10}$ (=10V) and the power supply voltage $V_5$ (=5V) is 5V. Thus, voltages imposed at gate-source, gate-drain and drain-source of TTFs (not shown) in the inverter 77 are not more than 5V, and thus do not exceed the TFT withstanding voltages as shown in FIG. 2.

5V voltage output from the inverter 77 is provided to the TFT 71. The TFT 71 receives power supply voltage $V_{10}$ (=10V) through source S, and thus gate-source voltage Vgs of the TFT 71 is −5V. The TFT 71 turns on because its threshold voltage Vth is about −2V. Power supply voltage $V_{10}$ is provided to the node N1 due to turning-on of the TFT 71, and thus voltage Vn1 at the node N1 becomes 10V.

5V voltage output from the inverter 77 is also provided to the gate G of the TFT 73. The TFT 73 receives power supply voltage $V_5$ (=5V) through source S thereof and therefore gate-source voltage Vgs of TFT 73 becomes 0V. Voltage Vn1 at node N1 is 10V, and thus gate-drain voltage Vgd of TFT 73 is −5V. TFT 73 turns off because its threshold voltage Vth is about 2V. Thus, power supply voltage $V_{10}$ is provided to node N1, but power supply voltage $V_5$ is not provided to node N1.

The inverter 90 receives 5V voltage and outputs 0V voltage. The inverter 90 receives 5V voltage through the input terminal 90a, and power supply voltages V5 and V0 respectively through the first and second terminals 90b and 90c. In this state, difference between the voltage at the input terminal 90a (=5V) and power supply voltage $V_5$ (=5V) is 0V, difference between the voltage at the input terminal 90a (=5V) and power supply voltage $V_0$ (=0V) is 5V, and difference between power supply voltage $V_5$ (=5V) and power supply voltage $V_0$ (=0V) is 5V. Thus, voltages imposed at gate-source, gate-drain and drain-source of TTFs (not shown) in the inverter 90 are not more than 5V, and thus do not exceed the TFT withstanding voltages as shown in FIG. 2.

When the inverter 90 outputs 0V voltage, 0V voltage is provided to the gate G of the TFT 70. Voltage at source S of the TFT 70 is 10V, and therefore gate-source voltage Vgs of TFT 70 is −10V. The TFT 70 turns on because its threshold voltage Vth is about −2V. Both TFT 71 and TFT 70 turn on, and thus power supply voltage $V_{10}$ is provided to node N0. At this time, gate-source voltages Vgs, gate-drain voltages Vgd and drain-source voltages Vds of TFTs 70, 71 and 73 are shown in FIG. 11.

FIG. 11 shows voltages Vgs, Vgd and Vds of TFTs 70, 71 and 73 when the second circuit potion 120 receives 5V voltage from the input portion 120a.

Absolute values of the voltages Vgs, Vgd and Vds of TFTs 70, 71 and 73 are not more than 10V. Thus, voltages imposed to the TFTs 70, 71 and 73 do not exceed the withstanding voltages (referring to FIG. 2) of TFTs 70, 71 and 73.

When the control portion 85 receives 5V voltage, the 5V voltage is input to the level shifter 86. The level shifter 86 outputs 0V voltage Va2 after receiving 5V voltage. The level shifter 86 receives 5V voltage through the input terminal 86a, respectively receives power supply voltages $V_0$ (=0V) and $V_{-5}$ (=−5V) through the first and second terminals 86b and 86c. In this state, difference between the voltage Vhigh (=5V) at the input terminal 86a and the power supply voltage $V_0$ (=0V) is 5V, difference between the voltage Vhigh (=5V) and the power supply voltage $V_{-5}$ (=−5V) is 10V, and difference between the voltage $V_0$ (=0V) and the power supply voltage $V_{-5}$ (=−5V) is 5V. Thus, voltages imposed at gate-source, gate-drain and drain-source of TTFs (not shown) in the level shifter 86 are not more than 10V, and thus do not exceed the TFT withstanding voltages as shown in FIG. 2.

The inverter 87 inversely converts 0V voltage Va2 output from the level shifter 86 and outputs −5V voltage. The inverter 87 receives 0V voltage through the input terminal 87a, and power supply voltages $V_0$ and $V_{-5}$ respectively through the first and second terminals 87b and 87c. In this state, difference between the voltage Va2 (=0V) at the input terminal 87a and the power supply voltage $V_0$ (=0V) is 0V, difference between the voltage Va2 (=0V) and the power supply voltage $V_{-5}$ (=−5V) is 5V, and difference between the voltage $V_0$ (=0V) and the power supply voltage $V_{-5}$ (=−5V) is 5V. Thus, voltages imposed at gate-source, gate-drain and drain-source of TTFs (not shown) in the inverter 87 are not more than 5V, and thus do not exceed the TFT withstanding voltages as shown in FIG. 2.

−5V voltage output from the inverter 87 is provided to the TFT 81. The TFT 81 receives power supply voltage $V_{-5}$ (=−5V) through source S thereof, and thus gate-source voltage Vgs of the TFT 81 is 0V. −5V voltage output from the inverter 87 is also provided to the gate G of the TFT 83. The TFT 83 receives power supply voltage $V_0$ (=0V) through source S thereof, and thus gate-source voltage Vgs of the TFT 83 is −5V. The TFT 83 turns on because its threshold voltage is about −2V, and thus power supply voltage $V_0$ (=0V) is provided to node N2. The gate-drain voltage Vgd is −5V. As a result, voltages Vgs and Vgd of TFT 81 are 0V and −5V. The TFT 81 turns off because its threshold voltage is about 2V.

At this time, the inverter 90 outputs 0V voltage, and therefore 0V voltage is provided to gate G of the TFT 80. Voltage at source S of TFT 80 is 0V, and thus gate-drain voltage Vgd is 0V. It is noted that both TFTs 71 and 70 turn on. Thus, 10V voltage is provided to drain D of TFT 80. Gate-drain voltage Vgd of TFT 80 is −10V because voltage at gate G of TFT 80 is 0V. TFT 80 turns off because its threshold voltage is about 2V. Due to turning-off of TFT 80, power supply voltage $V_{-5}$ and $V_0$ are not provided to node N0. At this time, gate-source voltages Vgs, gate-drain voltages Vgd and drain-source voltages Vds of TFTs 80, 81 and 83 are shown in FIG. 12.

FIG. 12 shows voltages Vgs, Vgd and Vds of TFTs 80, 81 and 83 when the second circuit potion 120 receives 5V voltage from the input portion 120a.

Absolute values of the voltages Vgs, Vgd and Vds of TFTs 80, 81 and 83 are not more than 10V. Thus, voltages imposed to the TFTs 80, 81 and 83 do not exceed the withstanding voltages (referring to FIG. 2) of TFTs 80, 81 and 83.

Accordingly, power supply voltage $V_{10}$ (=10V) is supplied to node N0, but power supply voltages $V_5$, $V_0$ and $V_{-5}$ are not. The second circuit portion 120 outputs 10V voltage from the output portion 120b.

The second circuit portion 120 outputs 10V voltage from output portion 120b. Thus, difference between the voltage (−5V) at source S of TFT 81 and the voltage (10V) at the node N0 is 15V, and withstanding voltages between drain and source of each TFTs 80 and 81 is only 10V (referring to FIG. 2). In this embodiment, it is noted that TFT 83 turns on when the second circuit portion 120 outputs 10V voltage from output portion 120b, and therefore power supply voltage $V_0$ is supplied to node N2. As a result, voltage Vn2 at node N2 is held at $V_0$ (=0V), voltage Vds of TFT 80 is held at 10V and voltage Vds of TFT 81 is held at 5V, preventing voltages imposed at drain-source of TFT 81 and drain-source of TFT 80 from exceeding withstanding voltages (referring to FIG. 2) of TFTs 80 and 81.

The second circuit portion 120 outputs 10V voltage after receiving 5V voltage, without violating requirement of withstanding voltages (referring to FIG. 2).

(2) Circuit Operation When the Second Circuit Portion 120 Receives 0V Voltage From the Input Portion 120a:

When the input portion 120a receives voltage Vlow (=0V), the 0V voltage is supplied to the control portions 75, 90 and 85.

When the control portion 85 receives 0V voltage, the 0V voltage is input to the level shifter 86. The level shifter 86 outputs −5V voltage Va2 after receiving 0V voltage. The level shifter 86 receives 0V voltage through the input terminal 86a, and respectively receives power supply voltages $V_0$ and $V_{-5}$ through the first and second terminals 86b and 86c. In this state, difference between the voltage Vlow (=0V) at the input terminal 86a and the power supply voltage $V_0$ (=0V) is 0V, difference between the voltage Vlow (=0V) and the power supply voltage $V_{-5}$ (=−5V) is 5V, and difference between the voltage $V_0$ (=0V) and the power supply voltage $V_{-5}$ (=−5V) is 5V. Thus, voltages imposed at gate-source, gate-drain and drain-source of TTFs (not shown) in the level shifter 86 are not more than 5V, and thus do not exceed the TFT withstanding voltages as shown in FIG. 2.

The inverter 87 inversely converts −5V voltage Va2 output from the level shifter 86 and outputs −5V voltage. The inverter 87 receives −5V voltage through the input terminal 87a, and power supply voltages $V_0$ and $V_{-5}$ respectively through the first and second terminals 87b and 87c. In this state, difference between the voltage Va2 (=−5V) at the input terminal 87a and the power supply voltage $V_0$ (=0V) is 5V, difference between the voltage Va2 (=−5V) and the power supply voltage $V_0$ (=0V) is 0V, and difference between the voltage $V_0$ (=0V) and the power supply voltage $V_{-5}$ (=−5V) is 5V. Thus, voltages imposed at gate-source, gate-drain and drain-source of TTFs (not shown) in the inverter 87 are not more than 5V, and thus do not exceed the TFT withstanding voltages as shown in FIG. 2.

0V voltage output from the inverter 87 is provided to the TFT 81. The TFT 81 receives power supply voltage $V_{-5}$ (=−5V) through source S thereof, and thus gate-source voltage Vgs of the TFT 81 is 5V. The TFT 81 turns on because its threshold voltage Vth is about 2V. Power supply voltage $V_{-5}$ is provided to the node N2 due to turning-on of the TFT 81, and thus voltage Vn2 at the node N2 becomes −5V.

0V voltage output from the inverter 87 is also provided to the gate G of the TFT 83. The TFT 83 receives power supply voltage $V_0$ (=0V) through source S thereof and therefore gate-source voltage Vgs of TFT 83 becomes 0V. Voltage Vn2 at node N2 is −5V, and thus gate-drain voltage Vgd of TFT 83 is 5V. TFT 83 turns off because its threshold voltage Vth is about −2V. Thus, power supply voltage $V_{-5}$ is provided to node N2, but power supply voltage $V_0$ is not provided to node N2.

The inverter 90 receives 0V voltage and outputs 5V voltage. The inverter 90 receives 0V voltage through the input terminal 90a, and power supply voltages $V_5$ and $V_0$ respectively through the first and second terminals 90b and 90c. In this state, difference between voltage (0V) at the input terminal 90a and power supply voltage $V_5$ (=5V) is 5V, difference between voltage (0V) at the input terminal 90a and power supply voltage $V_0$ (=0V) is 0V, and difference between power supply voltage $V_5$ (=5V) and power supply voltage $V_0$ (=0V) is 5V. Thus, voltages imposed at gate-source, gate-drain and drain-source of TTFs (not shown) in the inverter 90 are not more than 5V, and thus do not exceed the TFT withstanding voltages as shown in FIG. 2.

When the inverter 90 outputs 5V voltage, 5V voltage is provided to the gate G of the TFT 80. Voltage at source S of the TFT 80 is 5V, and therefore gate-source voltage Vgs of TFT 80 is 10V. The TFT 80 turns on because its threshold voltage Vth is about 2V. Both TFT 81 and TFT 80 turn on, and thus power supply voltage $V_{-5}$ is provided to node N0. At this time, gate-source voltages Vgs, gate-drain voltages Vgd and drain-source voltages Vds of TFTs 80, 81 and 83 are shown in FIG. 13.

FIG. 13 shows voltages Vgs, Vgd and Vds of TFTs 80, 81 and 83 when the second circuit potion 120 receives 0V voltage from the input portion 120a.

It is clear from FIG. 13 that absolute values of the voltages Vgs, Vgd and Vds of TFTs 80, 81 and 83 are not more than 10V. Thus, voltages imposed to the TFTs 80, 81 and 83 do not exceed the withstanding voltages (referring to FIG. 2) of TFTs 80, 81 and 83.

On the other hand, when the control portion 75 receives 0V voltage, the 0V voltage is input to the level shifter 76. The level shifter 76 outputs 5V voltage Va1 after receiving 0V voltage. The level shifter 76 receives 0V voltage through the input terminal 76a, and respectively receives power supply voltages $V_{10}$ and $V_5$ through the first and second terminals 76b and 76c. In this state, difference between the voltage Vlow (=0V) at the input terminal 76a and the power supply voltage $V_{10}$ (=10V) is 10V, difference between the voltage Vlow (=0V) and the power supply voltage $V_5$ (=5V) is 5V, and difference between the voltage $V_{10}$ (=10V) and the power supply voltage $V_5$ (=5V) is 5V. Thus, voltages imposed at gate-source, gate-drain and drain-source of TTFs (not shown) in the level shifter 76 are not more than 10V, and thus do not exceed the TFT withstanding voltages as shown in FIG. 2.

The inverter 77 inversely converts 5V voltage of Va1 output from the level shifter 76 and outputs 10V voltage. The inverter 77 receives 5V voltage through the input terminal 77a, and power supply voltages $V_{10}$ and $V_5$ respectively through the first and second terminals 77b and 77c. In this state, difference between the voltage Va1 (=5V) at the input terminal 77a and the power supply voltage $V_{10}$ (=10V) is 5V, difference between the voltage Va1 (=5V) and the power supply voltage $V_5$ (=5V) is 0V, and difference between the voltage $V_{10}$ (=10V) and the power supply voltage $V_5$ (=5V) is 5V. Thus, voltages imposed at gate-source, gate-drain and drain-source of TTFs (not shown) in the inverter 77 are not more than 5V, and thus do not exceed the TFT withstanding voltages as shown in FIG. 2.

10V voltage output from the inverter 77 is provided to the TFT 71. The TFT 71 receives power supply voltage $V_{10}$ (=10V) through source S thereof, and thus gate-source voltage Vgs of the TFT 71 is 0V. 10V voltage output from the inverter 77 is also provided to the gate G of the TFT 73. The TFT 73 receives power supply voltage $V_5$ (=5V) through source S thereof, and thus gate-source voltage Vgs of the TFT 73 is 5V. The TFT 73 turns on because its threshold voltage is about 2V, and thus power supply voltage $V_5$ (=5V) is provided to node N1. The gate-drain voltage Vgd is 5V. As a result, voltages Vgs and Vgd of TFT 71 are 0V and 5V. The TFT 71 turns off because its threshold voltage is about −2V.

At this time, the control portions (inverter) 90 outputs 5V voltage, and therefore 5V voltage is provided to gate G of the TFT 70. Voltage at source S of TFT 70 is 5V, and thus gate-drain voltage Vgd is 0V. It is noted that both TFTs 81 and 80 turn on. Thus, $V_{-5}$ (−5V) voltage is provided to drain D of TFT 70. Gate-drain voltage Vgd of TFT 70 is 10V because voltage at gate G of TFT 70 is 5V and Vgs of TFT 70 is 0V. TFT 70 turns off because its threshold voltage is about −2V. Due to turning-off of TFT 70, power supply voltage $V_{10}$ and $V_5$ are not provided to node N0. At this time, gate-source voltages Vgs, gate-drain voltages Vgd and drain-source voltages Vds of TFTs 70, 71 and 73 are shown in FIG. 14.

FIG. 14 shows voltages Vgs, Vgd and Vds of TFTs 70, 71 and 73 when the second circuit potion 120 receives 0V voltage from the input portion 120a.

It is clear from FIG. 14 that absolute values of the voltages Vgs, Vgd and Vds of TFTs 70, 71 and 73 are not more than 10V. Thus, voltages imposed to the TFTs 70, 71 and 73 do not exceed the withstanding voltages (referring to FIG. 2) of TFTs 70, 71 and 73.

Accordingly, power supply voltage $V_{-5}$ (=−5V) is supplied to node N0, but power supply voltages $V_{10}$, $V_5$ and $V_0$ are not. The second circuit portion 120 outputs −5V voltage from the output portion 120b.

The second circuit portion 120 outputs −5V voltage from output portion 120b. Thus, difference between the voltage (10V) at source S of TFT 71 and the voltage (−5V) at the node N0 is 15V, and withstanding voltages between drain and source of each TFTs 70 and 71 are only 10V (referring to FIG. 2). In this embodiment, it is noted that TFT 73 turns on when the second circuit portion 120 outputs −5V voltage from the output portion 120b, and therefore power supply voltage $V_5$ (=5V) is supplied to node N1. As a result, voltage Vn1 at node N1 is held at $V_5$ (=5V), voltage Vds of TFT 70 is held at −10V and voltage Vds of TFT 71 is held at −5V, preventing voltages imposed at drain-source of TFT 71 and drain-source of TFT 70 from exceeding withstanding voltages (referring to FIG. 2) of TFTs 70 and 71.

In view of the disclosure, the second circuit portion 120 outputs −5V voltage after receiving 0V voltage, without violating requirement of withstanding voltages (referring to FIG. 2).

In this embodiment, TFTs of the second circuit portion 120 have the same characteristics of withstanding voltage as that of TFTs 5 in the display region 2 (referring to FIG. 1), TFTs 8 in the source driver 9 (referring to FIG. 1) and TFTs 11 in the first circuit portion 10 (referring to FIG. 3). Thus, all TFTs can be fabricated on the glass substrate 1 (referring to FIG. 1) in similar size, enabling fabrication of TFTs by a single process type, reducing manufacturing cost and complexity.

In addition, only one combination of TFT 71 and TFT 73 is provided on the first route 72 between power supply voltage $V_{10}$ and node N0, and a plurality of such combinations of TFTs 71 and 73 can be provided on the first route 72.

Figure 15:
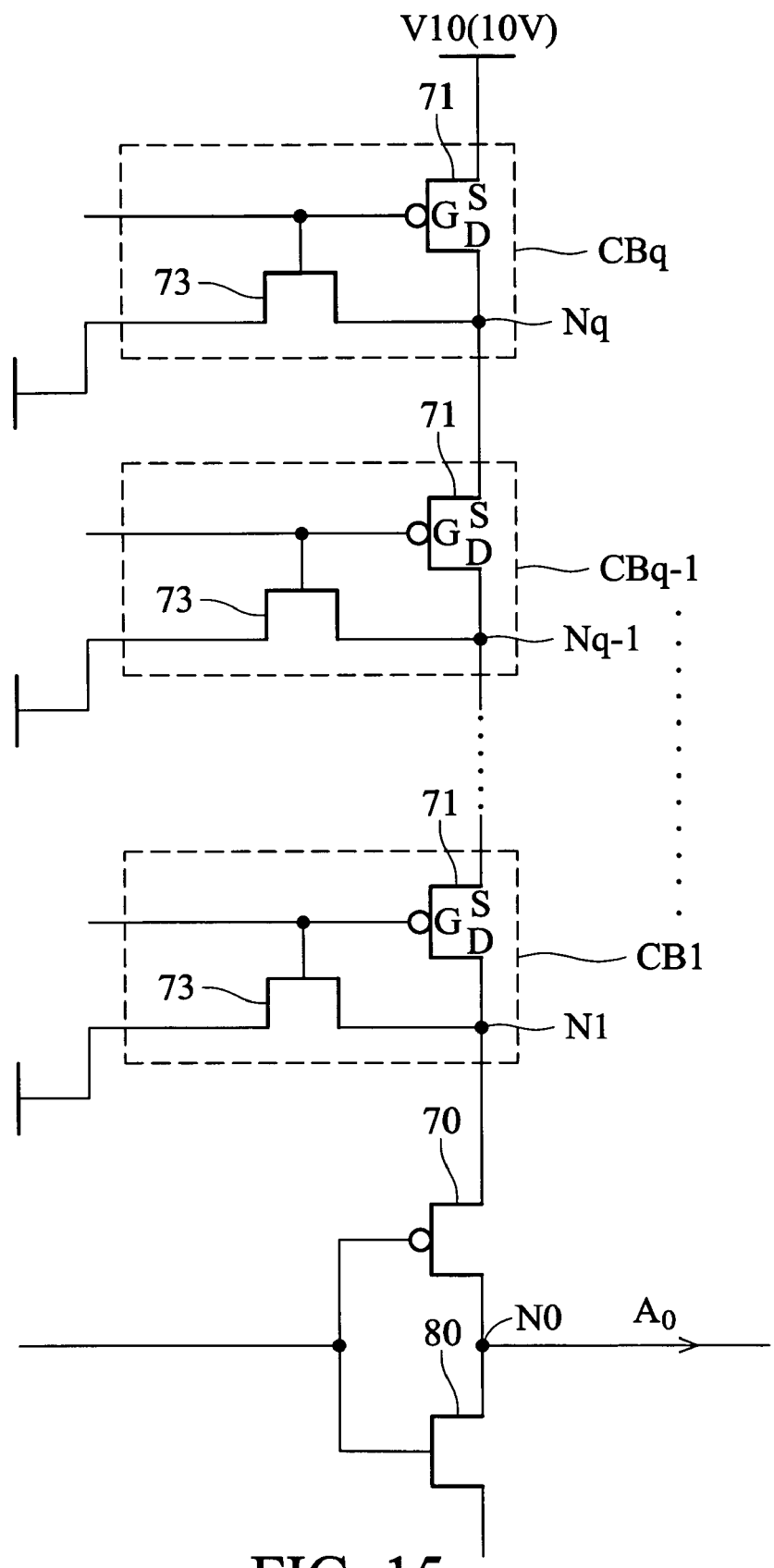
FIG. 15 schematically shows q combinations of TFT 71 and 73, i.e., CB1, . . . , CBq−1 and CBq, provided on the first route 72.

FIG. 15 schematically shows q combinations of TFT 71 and 73, i.e., CB1, . . . CBq−1 and CBq, provided on the first route 72.

In FIG. 15, combinations CB1, . . . , CBq−1 and CBq can respectively adjust voltages at nodes N1, . . . , Nq−1 and Nq. Thus, voltages imposed between source S and drain D of TFT 71 can be less than that shown in FIG. 10. Similarly, a plurality of combinations of TFT 81 and TFT 83 can be provided on the second route 82 which between the power voltage $V_{-5}$ and the node N0. Thus, circuits which output gate signals with large difference between positive gate voltages Vgp and negative gate voltage Vgn can be configured using TFTs with smaller withstanding voltages than that shown in FIG. 2.

In addition, the control portions 75, 85 and 90 all receive output signal C0 from the first circuit portion 10, the control portion 75 controls voltages at gates G of TFTs 71 and 73, the control portion 85 controls voltages at gates g of TFTs 81 and 83, and the control portion (inverter) 90 controls voltages at gates G of TFTs 70 and 80. However, the control portions 75, 85 and 90 can receive other signals to control gate voltages of TFTs.

In addition, the control portions 75, 85 and 90 control voltages at gates G of TFTs 70, 71, 73, 80, 81 and 83, and other circuits can also be used to control the TFTs.

While the embodiments focus on circuits outputting gate signals, the invention can be equally applied to various circuit configurations, not being limited to the embodiments.

While the invention has been described by way of example and in terms of preferred embodiment, it is to be understood that the invention is not limited thereto. To the contrary, it is intended to cover various modifications and similar arrangements (as would be apparent to those skilled in the art). Thus, the scope of the appended claims should be accorded the broadest interpretation so as to encompass all such modifications and similar arrangements.

What is claimed is:

1. A circuit device providing a first voltage to a node through a first route and a second voltage to the node through a second route, the circuit device comprising:
    a first switching device disposed on the first route;
    a second switching device disposed on the first route and directly connected with the first switching device;
    a third switching device disposed on the second route;
    a fourth switching device disposed on the second route and directly connected with the third device;
    a third route providing a third voltage between the first and second voltages to between the first switching device and the second switching device; and
    a fourth route providing a fourth voltage between the first and second voltages to between the third device and the fourth switching device.

2. The circuit device as claimed in claim 1, further comprising a fifth switching device disposed on the third route and a sixth switching device disposed on the fourth route.

3. The circuit device as claimed in claim 2, wherein the first to sixth switching devices are transistors.

4. The circuit device as claimed in claim 3, wherein gates of the fifth and sixth switching devices are directly connected with the node.

5. The circuit device as claimed in claim 4, further comprising:
    a first control portion controlling voltage levels at gates of the first and second switching devices; and
    a second control portion controlling voltage levels at gates of the third and fourth switching devices.

6. The circuit device as claimed in claim 3, wherein the gates of the first and third switching devices are directly connected together, the gates of the second and fifth switching devices are directly connected together and the gates of the fourth and sixth switching devices are directly connected together.

7. The circuit device as claimed in claim 6, further comprising:
    a third control portion controlling voltage levels at the gates of the first and third switching devices;
    a fourth control portion controlling voltage levels at the gates of the second and fifth switching devices; and
    a fifth control portion controlling voltage levels at the gates of the fourth and sixth switching devices.

8. The circuit device as claimed in claim 7, further comprising a plurality of combinations of the second and fifth switching devices connected in series on the first route, or a plurality of combinations of the fourth and sixth switching devices connected in series on the second route.

9. The circuit device as claimed in claim 1, wherein the node exists between the first switching device and the third switching device.

10. The circuit device as claimed in claim 2, wherein the node exists between the first switching device and the third switching device.

11. The circuit device as claimed in claim 3, wherein the node exists between the first switching device and the third switching device.

12. The circuit device as claimed in claim 4, wherein the node exists between the first switching device and the third switching device.

13. The circuit device as claimed in claim 5, wherein the node exists between the first switching device and the third switching device.

14. The circuit device as claimed in claim 6, wherein the node exists between the first switching device and the third switching device.

15. The circuit device as claimed in claim 7, wherein the node exists between the first switching device and the third switching device.

16. The circuit device as claimed in claim 8, wherein the node exists between the first switching device and the third switching device.

* * * * *